United States Patent
Inoue et al.

(10) Patent No.: US 10,292,300 B2
(45) Date of Patent: May 14, 2019

(54) POWER SUPPLY APPARATUS

(71) Applicant: TOSHIBA MITSUBISHI-ELECTRIC INDUSTRIAL SYSTEMS CORPORATION, Chuo-ku (JP)

(72) Inventors: Fumihiko Inoue, Chuo-ku (JP); Yoshino Taniguchi, Chuo-ku (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days.

(21) Appl. No.: 15/765,417

(22) PCT Filed: Oct. 30, 2015

(86) PCT No.: PCT/JP2015/080718
§ 371 (c)(1),
(2) Date: Apr. 2, 2018

(87) PCT Pub. No.: WO2017/072946
PCT Pub. Date: May 4, 2017

(65) Prior Publication Data
US 2018/0295740 A1   Oct. 11, 2018

(51) Int. Cl.
*H05K 7/18* (2006.01)
*H05K 7/14* (2006.01)

(52) U.S. Cl.
CPC ......... *H05K 7/183* (2013.01); *H05K 7/1432* (2013.01); *H05K 7/1488* (2013.01)

(58) Field of Classification Search
CPC ..... H05K 7/183; H05K 7/1432; H05K 7/1488
See application file for complete search history.

(56) References Cited

U.S. PATENT DOCUMENTS 6,601,713 B2 *  8/2003  Kaminski ............ H05K 7/1489
                                                        211/175
2010/0265651 A1 * 10/2010  Huang .................. G06F 1/183
                                                        361/679.39
(Continued)

FOREIGN PATENT DOCUMENTS

JP   58-16232 Y2 *  4/1983
JP   58-110099 A  *  6/1983
(Continued)

OTHER PUBLICATIONS

International Search Report dated Feb. 2, 2016 in PCT/JP2015/080718 filed Oct. 30, 2015.

*Primary Examiner* — Nidhi Thaker
(74) *Attorney, Agent, or Firm* — Oblon, McClelland, Maier & Neustadt, L.L.P.

(57) ABSTRACT

A power supply apparatus includes a housing being self-standing and having an opening on a front side, and a unit disposed in the housing to be insertable and removable in a front-back direction through the opening. The unit includes a lower-left slide portion positioned at a left lower end when facing forward from inside the housing, a lower-right slide portion positioned at a right lower end when facing forward from inside the housing, and a hook portion disposed between the lower-left slide portion and the lower-right slide portion. The hook portion includes a hook base portion extending downward, and a hook tip portion extending forward from a lower end of the hook base portion.

16 Claims, 9 Drawing Sheets

(56) References Cited

U.S. PATENT DOCUMENTS

2014/0265788 A1* 9/2014 Judge .................. H05K 7/1489
                                                    312/334.1
2017/0164507 A1* 6/2017 Liao ...................... H05K 7/183

FOREIGN PATENT DOCUMENTS

JP            58-110099 A        6/1983
JP          2004249584 A    *    9/2004

* cited by examiner

POWER SUPPLY APPARATUS

TECHNICAL FIELD

The present invention relates to a power supply apparatus.

BACKGROUND ART

Japanese Patent Laying-Open No. 58-110099 (PTD 1) describes an apparatus for preventing an electronic device from overturning. In the apparatus described in this document, units are mounted in a housing and each unit can be pulled out from a front side. A guide rail configured to move in a front-back direction along with each unit is attached to each of right and left side surfaces of the unit, and sliding between this guide rail and a fixed rail fixed to an inner wall of the housing enables the unit to move in the front-back direction.

As for a power supply apparatus, there is a type of power supply apparatus having a plurality of units mounted in a housing, and each unit may be pulled out from a front side by an operator.

CITATION LIST

Patent Document

PTD 1: Japanese Patent Laying-Open No. 58-110099

SUMMARY OF INVENTION

Technical Problem

In the case of a power supply apparatus, at the time of the work such as inspection and repair, an operator pulls out a unit from a front side and performs the work. At this time, a fall of the unit must be avoided. On the other hand, it must be possible to pull out and remove the unit on the operator's own will when the necessity to replace the unit arises.

Conventionally, a mechanism for enabling sliding between a rail on a unit side and a rail on a housing side as described in PTD 1 above by providing the rail on an inner wall of a housing so as to be able to hold a unit in a pulled-out state to prevent the unit from falling has been considered. However, such a rail structure has required a considerable cost, and attachment of the rail structure has required time and effort because the number of components is large.

Accordingly, an object of the present invention is to provide a power supply apparatus including a mechanism that can prevent a unit from falling while enabling an operator to pull out the unit, that enables as-needed removal of the unit, that does not require time and effort for attachment, and that does not lead to an increase in cost.

Solution to Problem

In order to achieve the above-described object, a power supply apparatus according to the present invention includes a housing being self-standing and having an opening on a front side, and a unit disposed in the housing so as to be insertable and removable in a front-back direction through the opening. The unit includes a lower-left slide portion positioned at a left lower end when facing forward from inside the housing, a lower-right slide portion positioned at a right lower end when facing forward from inside the housing, and a hook portion disposed between the lower-left slide portion and the lower-right slide portion. The hook portion includes a hook base portion extending downward, and a hook tip portion extending forward from a lower end of the hook base portion. A left rail supporting the lower-left slide portion of the unit and extending in the front-back direction, a right rail supporting the lower-right slide portion of the unit and extending in the front-back direction, and a stopper disposed so as to connect an intermediate portion of the left rail and an intermediate portion of the right rail are arranged in the housing. The stopper has an inclined surface becoming lower toward the front side, and a stopper back end side extending in a right-left direction at a height and being exposed to a back side, the height being higher than an upper end of the hook tip portion of the unit and lower than an upper end of the hook base portion of the unit in a state where disposition in the housing is completed.

DESCRIPTION OF EMBODIMENTS

First Embodiment

Figure 1:
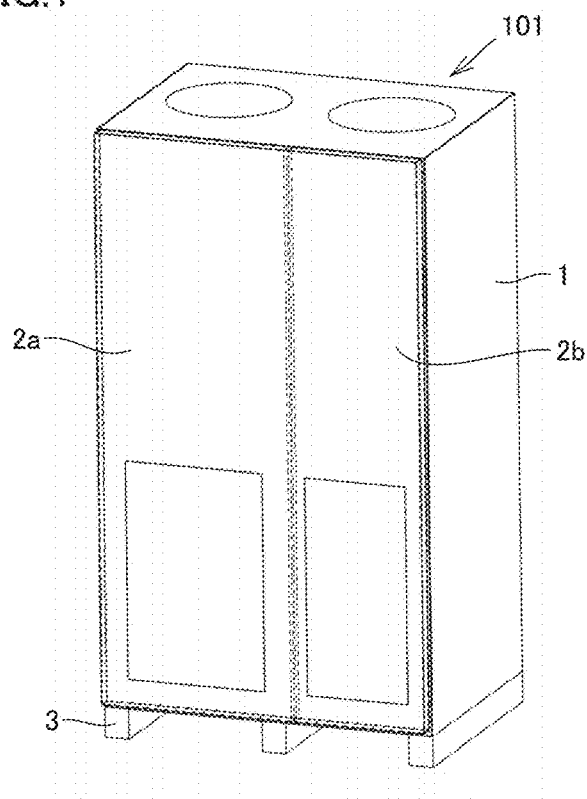
FIG. 1 is a perspective view of a power supply apparatus according to a first embodiment based on the present invention.
Figure 2:
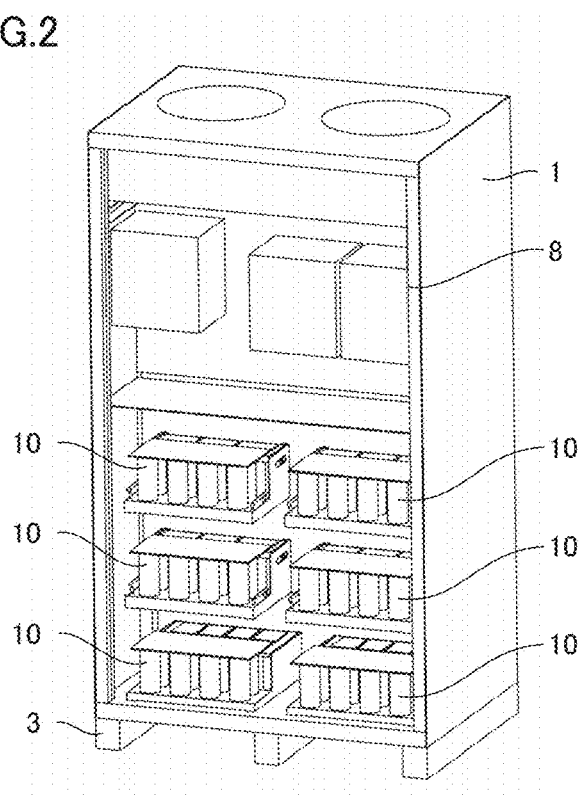
FIG. 2 is a perspective view of a state in which doors have been removed from the power supply apparatus according to the first embodiment based on the present invention.
Figure 3:
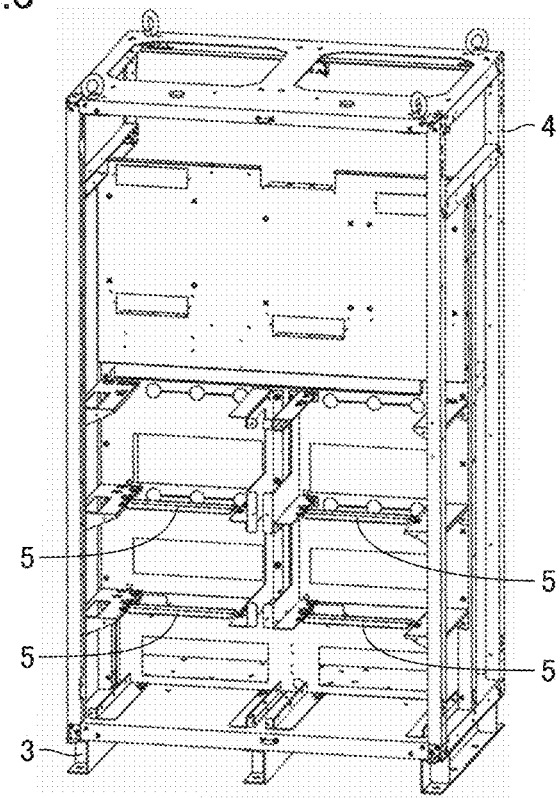
FIG. 3 is a perspective view of a state in which almost only a frame of the power supply apparatus according to the first embodiment based on the present invention has been left.

A power supply apparatus according to a first embodiment based on the present invention will be described with reference to FIGS. 1 to 17. FIG. 1 shows an outer appearance of a power supply apparatus 101 according to the present embodiment. Power supply apparatus 101 includes a housing 1, doors 2a and 2b configured to close a front side of housing 1, and a leg 3 disposed on a lower side of housing 1 to support housing 1. Doors 2a and 2b are openable and closable. FIG. 2 shows a state in which doors 2a and 2b have been removed from power supply apparatus 101. Housing 1 has an opening 8 on the front side. In FIG. 2, various devices disposed inside can be seen through opening 8. A plurality of units 10 are disposed in housing 1. Unit 10 may be, for example, a conversion unit including a capacitor, a cooling fin, a connector and the like. Although six units 10 are mounted in one housing 1 in the example shown in FIG. 2, the number of units 10 is not limited to six and may be the other number. FIG. 3 shows a state in which some components have been further removed from the state shown in FIG. 2. In FIG. 3, a frame 4 can be seen. Most of an outer shape of housing 1 is defined by frame 4.

Figure 4:
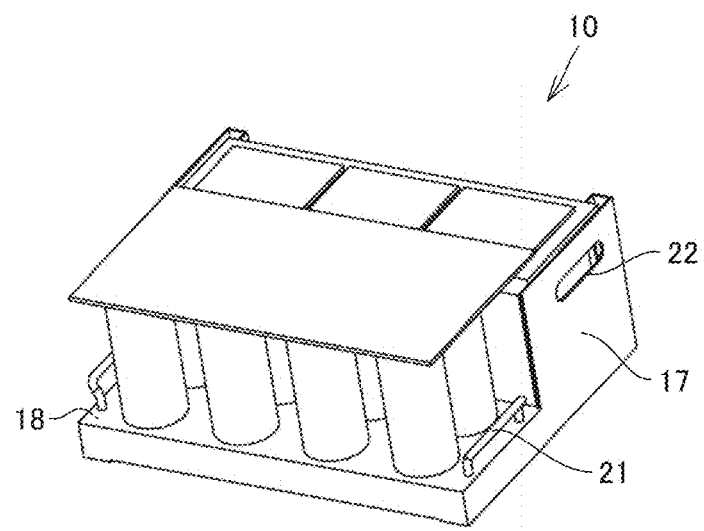
FIG. 4 is a first perspective view of a unit mounted in the power supply apparatus according to the first embodiment based on the present invention.
Figure 5:
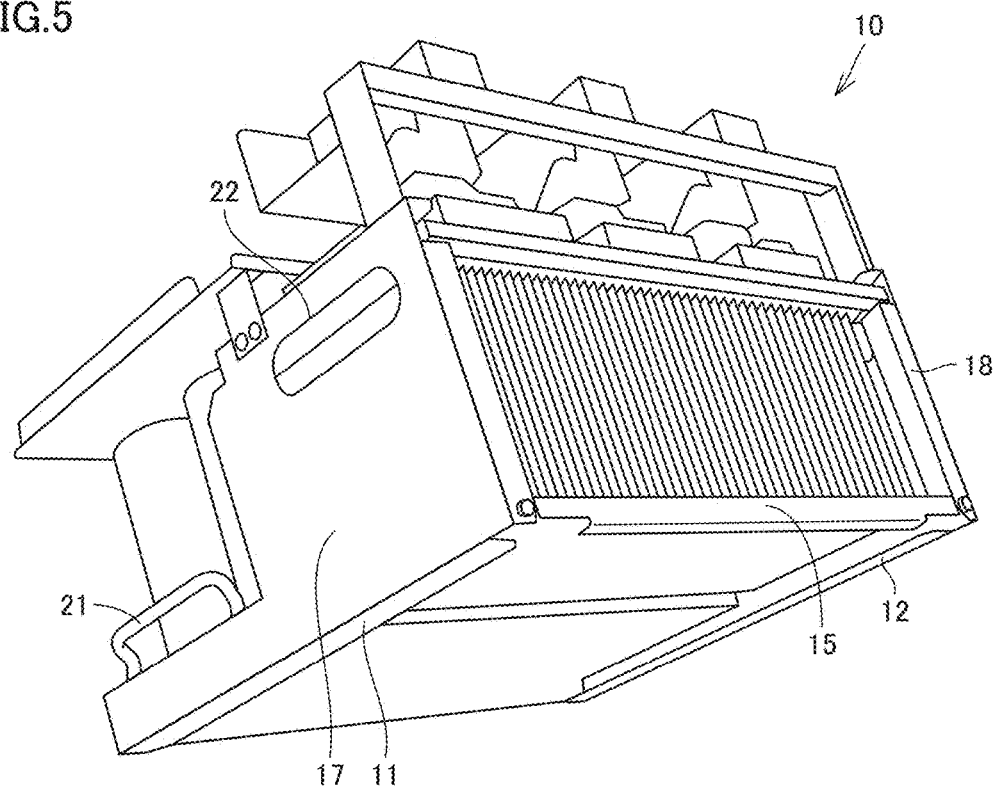
FIG. 5 is a second perspective view of the unit mounted in the power supply apparatus according to the first embodiment based on the present invention.
Figure 6:
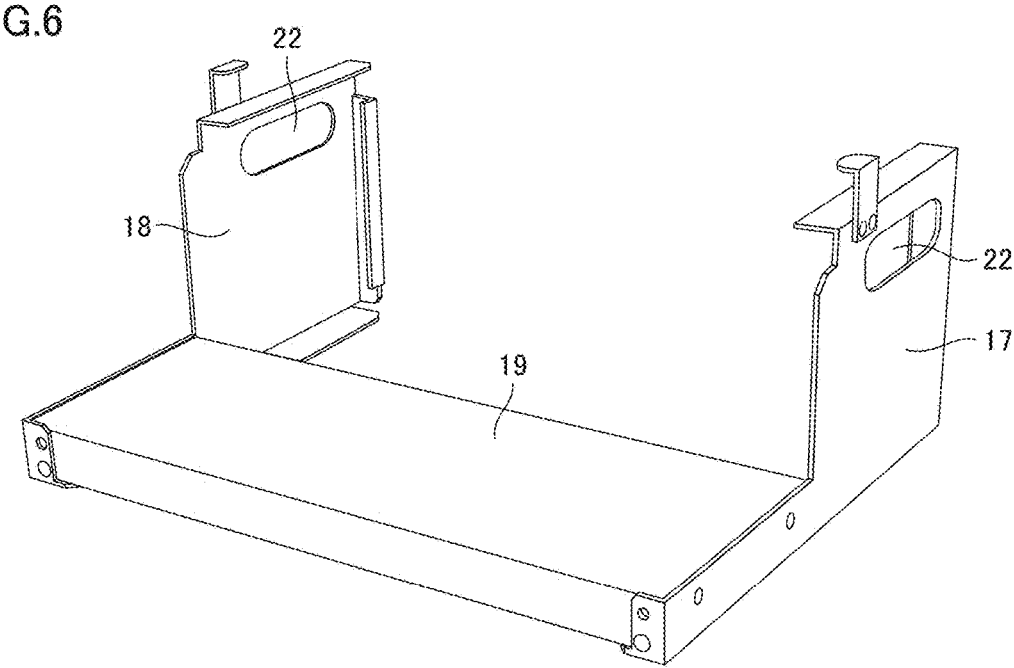
FIG. 6 is a perspective view of a part of the unit mounted in the power supply apparatus according to the first embodiment based on the present invention.
Figure 7:
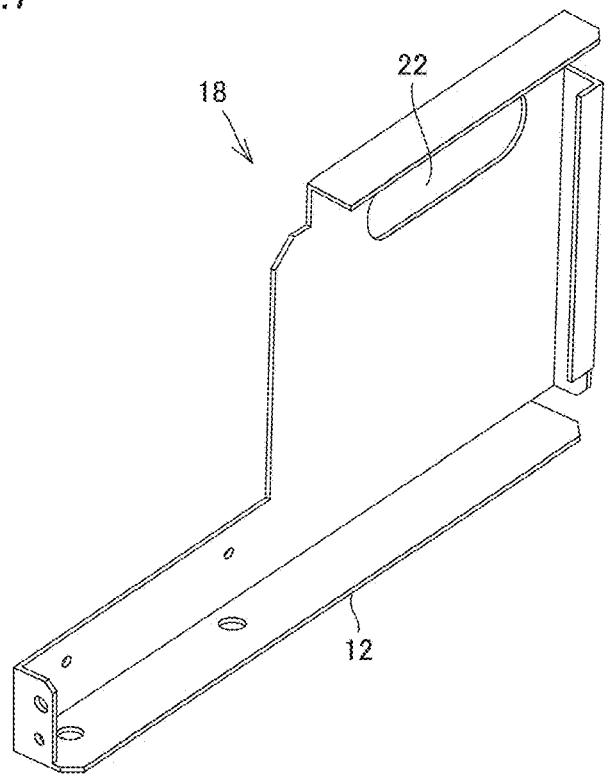
FIG. 7 is a perspective view of a right-side plate included in the unit mounted in the power supply apparatus according to the first embodiment based on the present invention.
Figure 8:
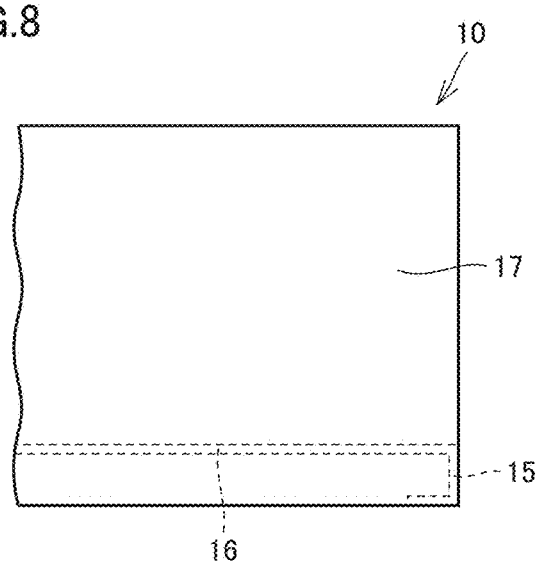
FIG. 8 is a partial side view of the unit mounted in the power supply apparatus according to the first embodiment based on the present invention.
Figure 9:
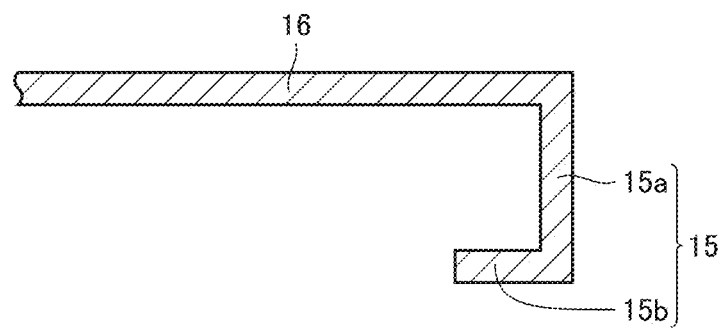
FIG. 9 is a cross-sectional view of a component included in the unit mounted in the power supply apparatus according to the first embodiment based on the present invention, the component being obtained by integrating a hook portion with a base plate.
Figure 10:
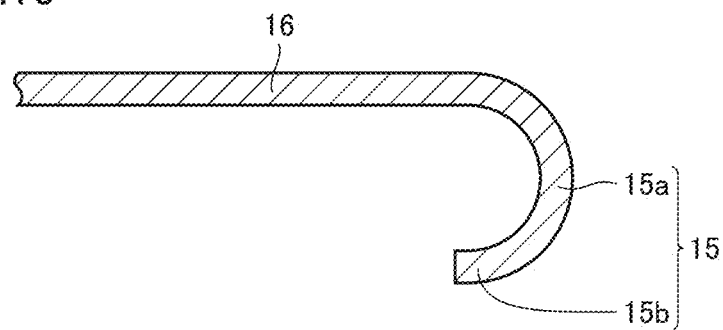
FIG. 10 is a cross-sectional view of a modification of the component included in the unit mounted in the power supply apparatus according to the first embodiment based on the present invention, the component being obtained by integrating the hook portion with the base plate.

FIG. 4 shows a state in which one of units 10 disposed in housing 1 has been taken out. In this example, unit 10 is a conversion unit. A specific structure of unit 10 shown here is merely one example and the structure is not limited thereto. In the example shown in FIG. 4, unit 10 includes a left-side plate 17 and a right-side plate 18. Unit 10 includes handles 21 on the right and left on the front side. On the right and left on a back side, unit 10 has handles 22 that are openings into which an operator puts his/her hands when holding unit 10. FIG. 5 shows unit 10 as viewed from the back and obliquely lower side. FIG. 6 shows a state in which only a part of unit 10 has been taken out. In FIG. 6, left-side plate 17, right-side plate 18, and a front-side base plate 19 disposed to connect these plates are shown. FIG. 7 shows a state in which only right-side plate 18 has been taken out. FIG. 8 shows a back portion of unit 10 as viewed laterally. A hook portion 15 and a base plate 16 are hidden behind left-side plate 17. Although hook portion 15 and base plate 16 are formed by an integral plate member in this example, hook portion 15 and base plate 16 may be formed by separate members, respectively, and then combined together. In FIG. 8, hook portion 15 and base plate 16 are shown by a broken line because hook portion 15 and base plate 16 are hidden behind left-side plate 17. FIG. 9 shows a partial cross-sectional view in the vicinity of a back end of a component obtained by integrating hook portion 15 with base plate 16. Hook portion 15 includes a hook base portion 15a and a hook tip portion 15b. Although hook portion 15 is a plate member bent at substantially a right angle twice as shown in FIG. 9 in the present embodiment, the shape is not limited thereto. Hook portion 15 may have a rounded shape as shown in FIG. 10. In this case, a certain portion near the tip can be regarded as hook tip portion 15b and a base-side portion other than this portion can be regarded as hook base portion 15a.

Figure 11:
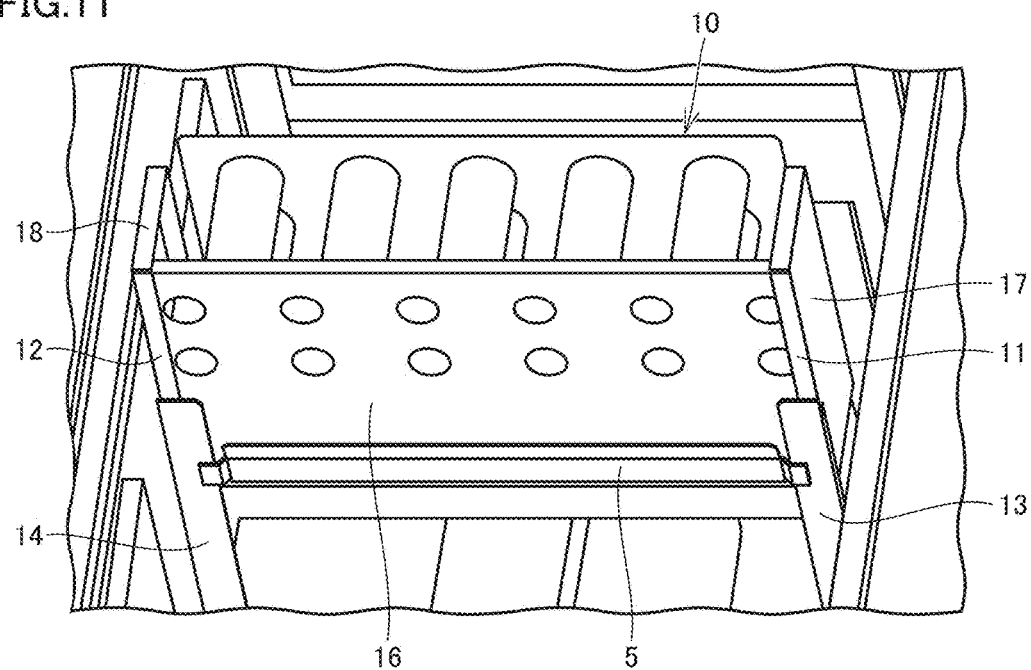
FIG. 11 is a perspective view of a state in which the unit has been pulled out halfway from the power supply apparatus according to the first embodiment based on the present invention.

FIG. 11 shows a state in which unit 10 placed in housing 1 has been pulled out halfway, as viewed from the obliquely lower side. For convenience of description, FIG. 11 shows only the relevant components. As shown in FIG. 11, a left rail 13 and a right rail 14 are disposed in housing 1 to extend in a front-back direction. A stopper 5 is connected so as to couple left rail 13 to right rail 14. A lower-left slide portion 11 of unit 10 rests on left rail 13. A lower-right slide portion 12 of unit 10 rests on right rail 14.

Figure 12:
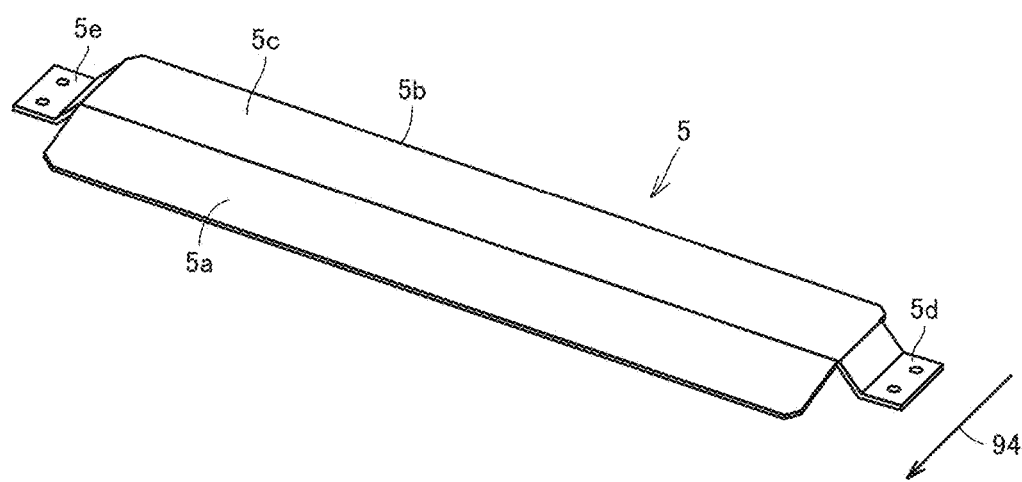
FIG. 12 is a perspective view of a stopper included in the power supply apparatus according to the first embodiment based on the present invention.

FIG. 12 shows a state in which only stopper 5 has been taken out. Stopper 5 is elongated in a right-left direction and is integrally formed by a metal plate. In FIG. 12, a direction of an arrow 94 corresponds to a forward direction. Stopper 5 has an inclined surface 5a on the front side, and a stopper back end side 5b on the back side. Stopper 5 has a flat stopper upper surface 5c between inclined surface 5a and stopper back end side 5b. Furthermore, stopper 5 includes stopper connection portions 5d and 5e at both right and left ends.

Figure 13:
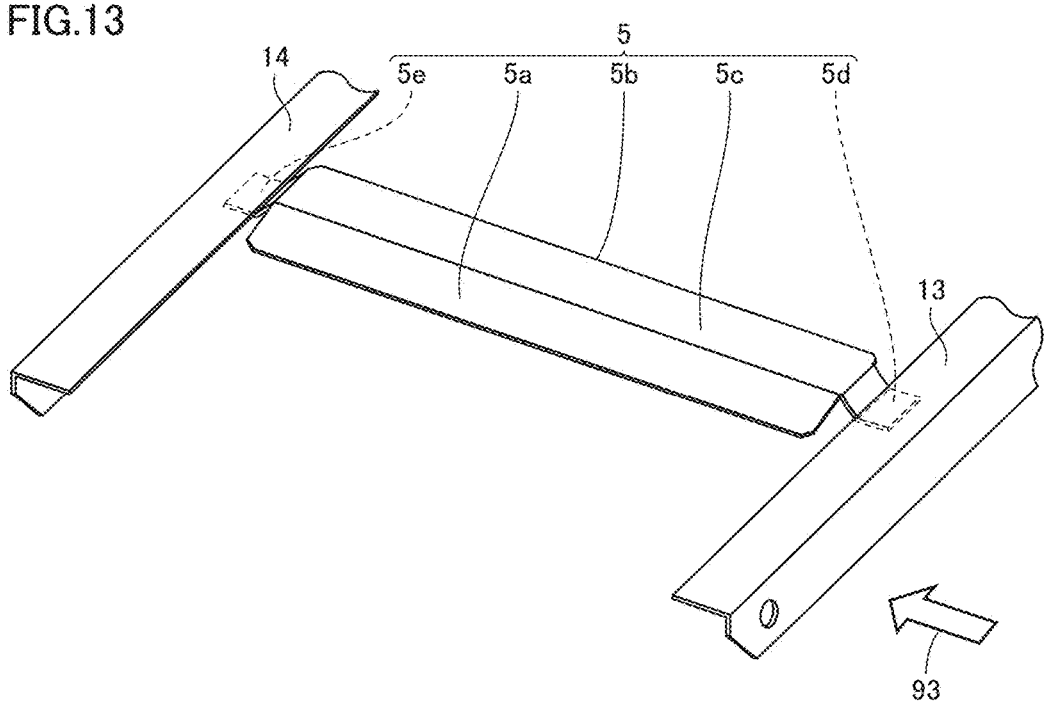
FIG. 13 is a partial perspective view of a structure obtained by combining a left rail, a right rail and the stopper included in the power supply apparatus according to the first embodiment based on the present invention.
Figure 14:
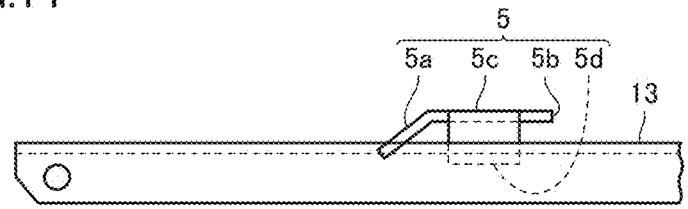
FIG. 14 is a partial side view of the structure shown in FIG. 13.

FIG. 13 shows a state in which stopper 5 has been attached to left rail 13 and right rail 14. Stopper connection portion 5d is connected to left rail 13. Stopper connection portion 5e is connected to right rail 14. The connection between stopper 5 and the rails may be made by screwing. FIG. 14 shows a state as viewed from a direction of an arrow 93 in FIG. 13. The upper surface of stopper 5 is located at a position higher than an upper surface of left rail 13. A lower end of stopper back end side 5b is located at a position higher than the upper surface of left rail 13.

Figure 15:
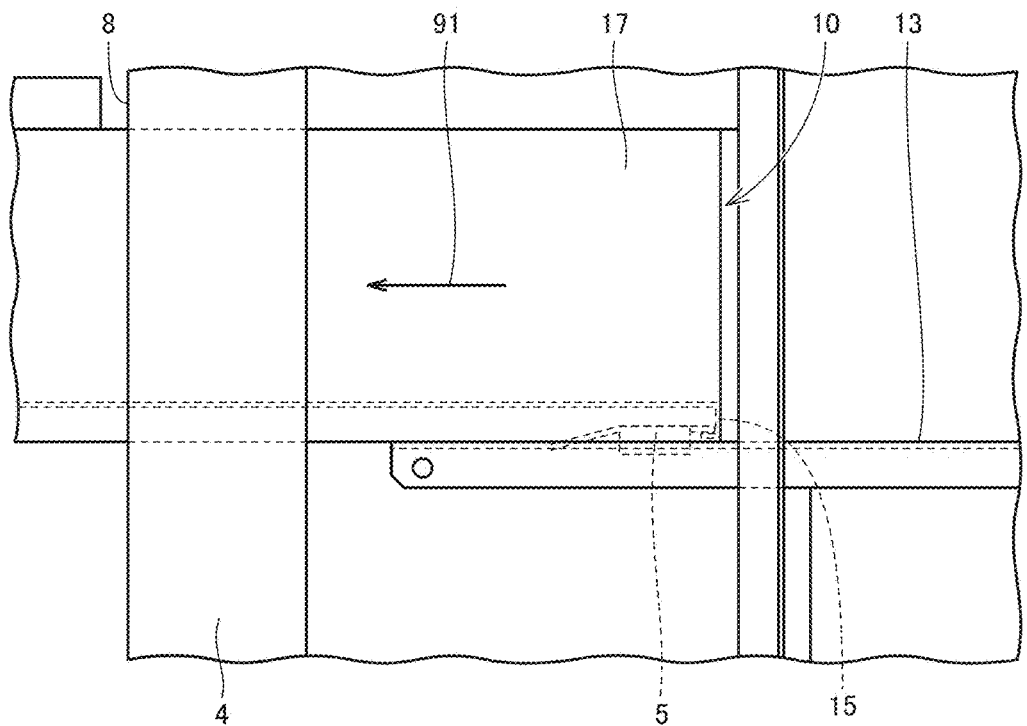
FIG. 15 is an explanatory view of a state in which the unit has been pulled out forward as much as possible through an opening.
Figure 16:
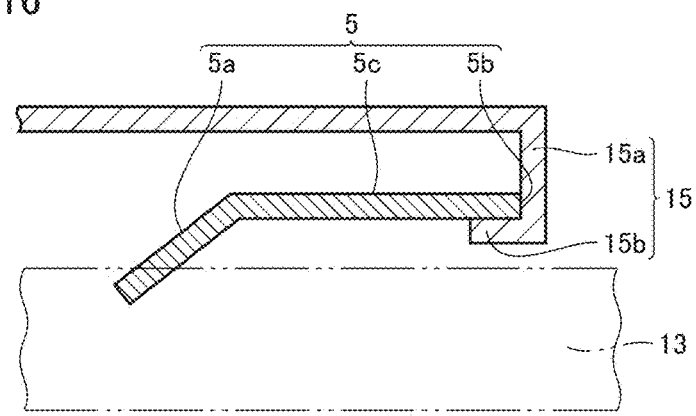
FIG. 16 is a partially enlarged cross-sectional view of a state in which the hook portion is in engagement with the stopper in the power supply apparatus according to the first embodiment based on the present invention.

FIG. 15 shows a state in which unit 10 has been pulled out forward as much as possible through opening 8. For convenience of description, FIG. 15 shows a state in which the plates on the side surfaces of housing 1 have been removed. This state is achieved at a point in time when unit 10 is pulled out forward to some extent in parallel along left rail 13 and right rail 14. Behind left-side plate 17, hook portion 15 is in engagement with stopper 5. This engagement prevents unit 10 from further moving forward. FIG. 16 shows a cross section. In this state, stopper back end side 5b is in contact with hook portion 15.

When the operator wants to completely pull out and remove unit 10, the operator may apply the downward force to the front side portion of unit 10 to slightly lift the back side of unit 10 and pull out unit 10 in this state. By doing so, hook portion 15 can climb over stopper 5 and move forward without engaging with stopper 5. In this way, unit 10 can be completely pulled out.

Figure 17:
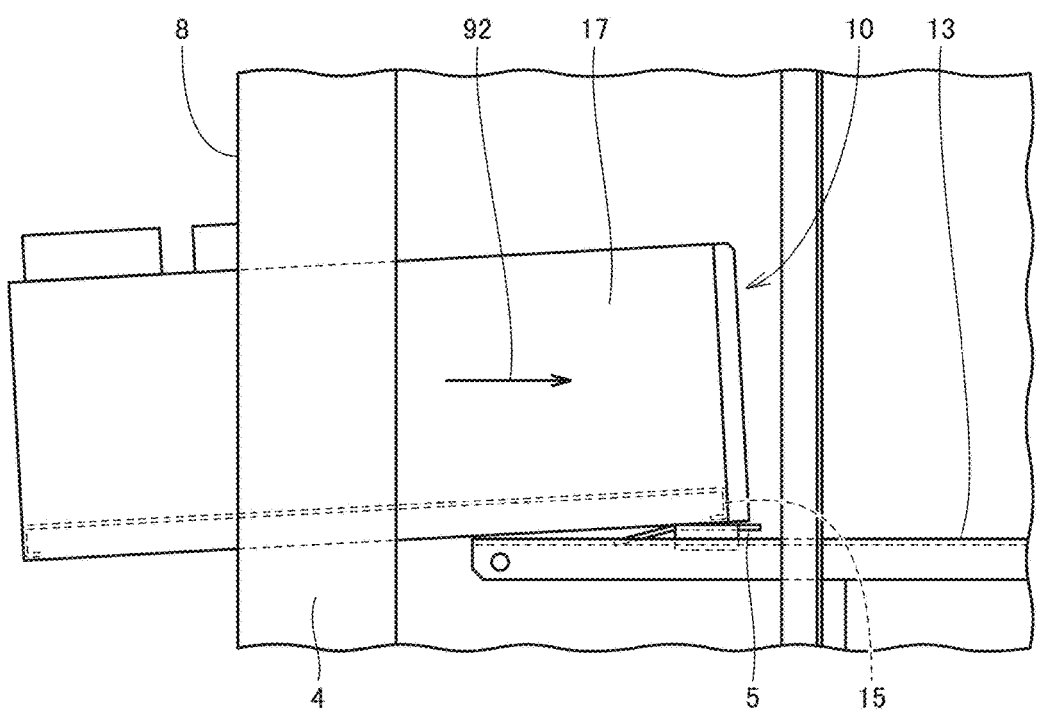
FIG. 17 is an explanatory view of a manner of climbing over the stopper when attempting to mount a unit newly introduced from outside in the housing.

When unit 10 newly introduced from outside is mounted in a state where unit 10 is not mounted on left rail 13 and right rail 14, unit 10 is pushed in from the front side as shown in FIG. 17, such that hook portion 15 can be pushed in along inclined surface 5a on the front side of stopper 5 and climb over stopper 5. In this way, unit 10 can be smoothly pushed in deeply.

Although unit 10 shown in FIGS. 11, 15 and 17 has a structure different from that of unit 10 shown in FIGS. 4, 5 and the like, unit 10 may actually have either of these structures. However, the structure of unit 10 is not limited to the two types of structures shown here, and various structures are possible.

The configuration of power supply apparatus 101 according to the present embodiment can be summarized as follows.

Power supply apparatus 101 according to the present embodiment includes housing 1 being self-standing and having opening 8 on a front side; and unit 10 disposed in housing 1 so as to be insertable and removable in a front-back direction through opening 8. Unit 10 includes lower-left slide portion 11 positioned at a left lower end when facing forward from inside housing 1, lower-right slide portion 12 positioned at a right lower end when facing forward from inside housing 1, and hook portion 15 disposed between lower-left slide portion 11 and lower-right slide portion 12. Hook portion 15 includes hook base portion 15a extending downward, and hook tip portion 15b extending forward from a lower end of hook base portion 15a. Left rail 13 supporting lower-left slide portion 11 of unit 10 and extending in the front-back direction, right rail 14 supporting lower-right slide portion 12 of unit 10 and extending in the front-back direction, and stopper 5 disposed so as to connect an intermediate portion of left rail 13 and an intermediate portion of right rail 14 are arranged in housing 1. Stopper 5 has inclined surface 5a becoming lower toward the front side, and stopper back end side 5b extending in a right-left direction at a height and being exposed to a back side, the height being higher than an upper end of hook tip portion 15b of unit 10 and lower than an upper end of hook base portion 15a of unit 10 in a state where disposition in housing 1 is completed.

The present embodiment is configured such that left rail 13 and right rail 14 placed in housing 1 support lower-left slide portion 11 and lower-right slide portion 12 of unit 10, and thus, unit 10 can be pulled out with a simple structure. Furthermore, in the present embodiment, stopper 5 and hook portion 15 are disposed, and thus, engagement of stopper 5 and hook portion 15 with each other can prevent unit 10 from further moving forward, and can prevent unit 10 from falling. In addition, unit 10 can be removed as needed. At the time of attachment of unit 10, the attachment work of unit 10 can be performed smoothly because stopper 5 has inclined surface 5a. In the present embodiment, the number of components is not so large and the assembly work is not complicated, either, and thus, an increase in cost does not occur.

Preferably, hook portion 15 is positioned backward with respect to a center of gravity of unit 10, and a distance in the front-back direction from hook portion 15 to the center of gravity of unit 10 is shorter than a distance from stopper 5 to a front end of left rail 13 or a front end of right rail 14. With this configuration, the center of gravity of unit 10 is always positioned backward with respect to the front end of left rail 13 or the front end of right rail 14 in a state where hook portion 15 is in engagement with stopper 5, and thus, unit 10 can rest on the rails in a stable manner. Therefore, an undesired fall of unit 10 can be prevented.

Preferably, stopper 5 is integrally formed by a metal plate. With this configuration, the number of components can be reduced and the cost can be reduced. Stopper 5 illustrated in FIG. 12 is integrally formed by a metal plate. Stopper 5 can be formed by processing the metal plate to have a prescribed shape and bending the metal plate as described above. The specific shape of stopper 5 is not limited to the shape shown in FIG. 12, and other shapes are possible.

Preferably, stopper 5 has flat stopper upper surface 5c between inclined surface 5a and stopper back end side 5b as shown in FIG. 12. The presence of stopper upper surface 5c itself is not essential. However, the presence of stopper upper surface 5c as described above enables smooth movement when unit 10 climbs over stopper 5 and moves forward or backward as shown in FIG. 17.

Preferably, unit 10 includes left-side plate 17 on a left side surface when facing forward from inside housing 1, and right-side plate 18 on a right side surface when facing forward from inside housing 1, and lower-left slide portion 11 is a lower end portion of left-side plate 17, and lower-right slide portion 12 is a lower end portion of right-side plate 18. With this configuration, an increase in the number of components can be suppressed. As shown in FIGS. 6 and 7, a rigid structure can be obtained with a smaller number of components.

Preferably, unit 10 includes handles 21 and 22 that an operator grips as shown in FIGS. 4 and 5. Handle 21 is formed by an additional component so as to protrude. Handle 21 may be formed by, for example, a metal rod. Handle 22 is an opening provided in the side plate. Handle 22 is an opening having a size that allows the operator to put his/her hand in the opening. As described above, various forms of handles are possible. The handles are preferably provided to be distributed on the right and left sides of unit 10. The handles are preferably provided symmetrically.

The plurality of conversion units housed in the lower part of the power supply apparatus have been regarded as units 10 and description has been provided above. However, the devices that may be regarded as units 10 in the power supply apparatus are not limited to the conversion units. A plurality of types of devices in one power supply apparatus may be regarded as "units". Another device that can be pulled out from the front side by the operator may be regarded as "unit", and a hook portion and a stopper may be provided for this device.

The above-described embodiment disclosed herein is illustrative and not limitative in any respect. The scope of the present invention is defined by the terms of the claims, rather than the description above, and is intended to include any modifications within the scope and meaning equivalent to the terms of the claims.

REFERENCE SIGNS LIST 1 housing; 2a, 2b door; 3 leg; 4 frame; 5 stopper; 5a inclined surface; 5b stopper back end side; 5c stopper upper surface; 5d, 5e stopper connection portion; 8 opening; 10 unit; 11 lower-left slide portion; 12 lower-right slide portion; 13 left rail; 14 right rail; 15 hook portion; 15a hook base portion; 15b hook tip portion; 16 base plate; 17 left-side plate; 18 right-side plate; 19 front-side base plate; 21, 22, 23 handle; 91, 92, 93, 94 arrow; 101 power supply apparatus.

The invention claimed is:

1. A power supply apparatus comprising:
a housing being self-standing and having an opening on a front side; and
a unit disposed in the housing so as to be insertable and removable in a front-back direction through the opening,
the unit comprising a lower-left slide portion positioned at a left lower end when facing forward from inside the housing, a lower-right slide portion positioned at a right lower end when facing forward from inside the housing, and a hook portion disposed between the lower-left slide portion and the lower-right slide portion,
the hook portion including a hook base portion extending downward, and a hook tip portion extending forward from a lower end of the hook base portion,
a left rail supporting the lower-left slide portion of the unit and extending in the front-back direction, a right rail supporting the lower-right slide portion of the unit and extending in the front-back direction, and a stopper disposed so as to connect an intermediate portion of the left rail and an intermediate portion of the right rail being arranged in the housing, the stopper having an inclined surface becoming lower toward the front side, and a stopper back end side extending in a right-left direction at a height and being exposed to a back side, the height being higher than an upper end of the hook tip portion of the unit and lower than an upper end of the hook base portion of the unit in a state where disposition in the housing is completed.

2. The power supply apparatus according to claim 1, wherein the hook portion is positioned backward with respect to a center of gravity of the unit, and a distance in the front-back direction from the hook portion to the center of gravity of the unit is shorter than a distance from the stopper to a front end of the left rail or a front end of the right rail.

3. The power supply apparatus according to claim 2, wherein the stopper is integrally formed by a metal plate.

4. The power supply apparatus according to claim 2, wherein the stopper has a flat stopper upper surface between the inclined surface and the stopper back end side.

5. The power supply apparatus according to claim 2, wherein the unit includes a left-side plate on a left side surface when facing forward from inside the housing, and a right-side plate on a right side surface when facing forward from inside the housing, and the lower-left slide portion is a lower end portion of the left-side plate, and the lower-right slide portion is a lower end portion of the right-side plate.

6. The power supply apparatus according to claim 2, wherein the unit includes a handle that an operator grips.

7. The power supply apparatus according to claim 1, wherein the stopper is integrally formed by a metal plate.

8. The power supply apparatus according to claim 7, wherein the stopper has a flat stopper upper surface between the inclined surface and the stopper back end side.

9. The power supply apparatus according to claim 7, wherein the unit includes a left-side plate on a left side surface when facing forward from inside the housing, and a right-side plate on a right side surface when facing forward from inside the housing, and the lower-left slide portion is a lower end portion of the left-side plate, and the lower-right slide portion is a lower end portion of the right-side plate.

10. The power supply apparatus according to claim 7, wherein the unit includes a handle that an operator grips.

11. The power supply apparatus according to claim 1, wherein the stopper has a flat stopper upper surface between the inclined surface and the stopper back end side.

12. The power supply apparatus according to claim 11, wherein the unit includes a left-side plate on a left side surface when facing forward from inside the housing, and a right-side plate on a right side surface when facing forward from inside the housing, and the lower-left slide portion is a lower end portion of the left-side plate, and the lower-right slide portion is a lower end portion of the right-side plate.

13. The power supply apparatus according to claim 11, wherein the unit includes a handle that an operator grips.

14. The power supply apparatus according to claim 1, wherein the unit includes a left-side plate on a left side surface when facing forward from inside the housing, and a right-side plate on a right side surface when facing forward from inside the housing, and the lower-left slide portion is a lower end portion of the left-side plate, and the lower-right slide portion is a lower end portion of the right-side plate.

15. The power supply apparatus according to claim 14, wherein the unit includes a handle that an operator grips.

16. The power supply apparatus according to claim 1, wherein the unit includes a handle that an operator grips.

* * * * *